(12) United States Patent
Tani et al.

(10) Patent No.: US 7,318,516 B2
(45) Date of Patent: Jan. 15, 2008

(54) SUBSTRATE TRANSFER APPARATUS FOR COMPONENT MOUNTING MACHINE

(75) Inventors: Noriyuki Tani, Kurume (JP); Noboru Furuta, Sakai (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 281 days.

(21) Appl. No.: 10/521,815

(22) PCT Filed: Aug. 4, 2003

(86) PCT No.: PCT/JP03/09887

§ 371 (c)(1),
(2), (4) Date: Jan. 21, 2005

(87) PCT Pub. No.: WO2004/016062

PCT Pub. Date: Feb. 19, 2004

(65) Prior Publication Data
US 2006/0042913 A1    Mar. 2, 2006

(30) Foreign Application Priority Data
Aug. 7, 2002    (JP) .............................. 2002-230278

(51) Int. Cl.
*H05K 13/00* (2006.01)
(52) U.S. Cl. .................................... 198/575; 198/339.1
(58) Field of Classification Search ................ 198/575, 198/576, 339.1, 341.01; 414/935
See application file for complete search history.

(56) References Cited

U.S. PATENT DOCUMENTS 3,817,368 A * 6/1974 Wentz et al. ................ 198/572
4,281,756 A * 8/1981 Bruno ....................... 198/369.2
5,186,308 A * 2/1993 Munro ........................ 198/572
5,960,930 A * 10/1999 Hawkins ..................... 198/577
6,286,654 B1 * 9/2001 Gorniak et al. .......... 198/347.4
6,405,851 B1   6/2002 Takeda
6,705,454 B2 * 3/2004 Fishaw et al. .............. 198/571

FOREIGN PATENT DOCUMENTS

| DE | 9409434 | 9/1994 |
| JP | 2000-022398 | 1/2000 |
| JP | 2000-118678 | 4/2000 |

OTHER PUBLICATIONS

English language Abstract of JP2000-118678.
English language Abstract of JP 2000-022398.
U.S. Appl. No. 10/451,637 to Satoshi Nonaka et al. which filed Jul. 10, 2003.

* cited by examiner

Primary Examiner—Mark A. Deuble
(74) Attorney, Agent, or Firm—Greenblum & Bernstein, P.L.C.

(57) ABSTRACT

A mounting-waiting process for making a substrate to be transferred into a mounting process wait before the mounting process; and a substrate discharge-waiting process for making the substrate transferred from the mounting process wait before the following process are provided. When transfer of an unmounted substrate into the mounting process and transfer of a mounted substrate from the mounting process to the substrate discharge-waiting process are performed simultaneously, it is detected, by a substrate-arrival detecting sensor for detecting the mounted substrate transferred to the substrate discharge-waiting process and a substrate-continuity detecting sensor for detecting the unmounted substrate continuously transferred following to the mounted substrate, that a plurality of substrates have been transferred into the discharge-waiting process continuously.

9 Claims, 7 Drawing Sheets

*Prior Art*

*Prior Art*

*Prior Art*

SUBSTRATE TRANSFER APPARATUS FOR COMPONENT MOUNTING MACHINE

TECHNICAL FIELD

The present invention relates to a substrate transfer apparatus used in a component mounting machine such as an electronic component mounting machine, for example, for transferring a substrate from a mounting-waiting process to a mounting process.

BACKGROUND ART

Figure 5:
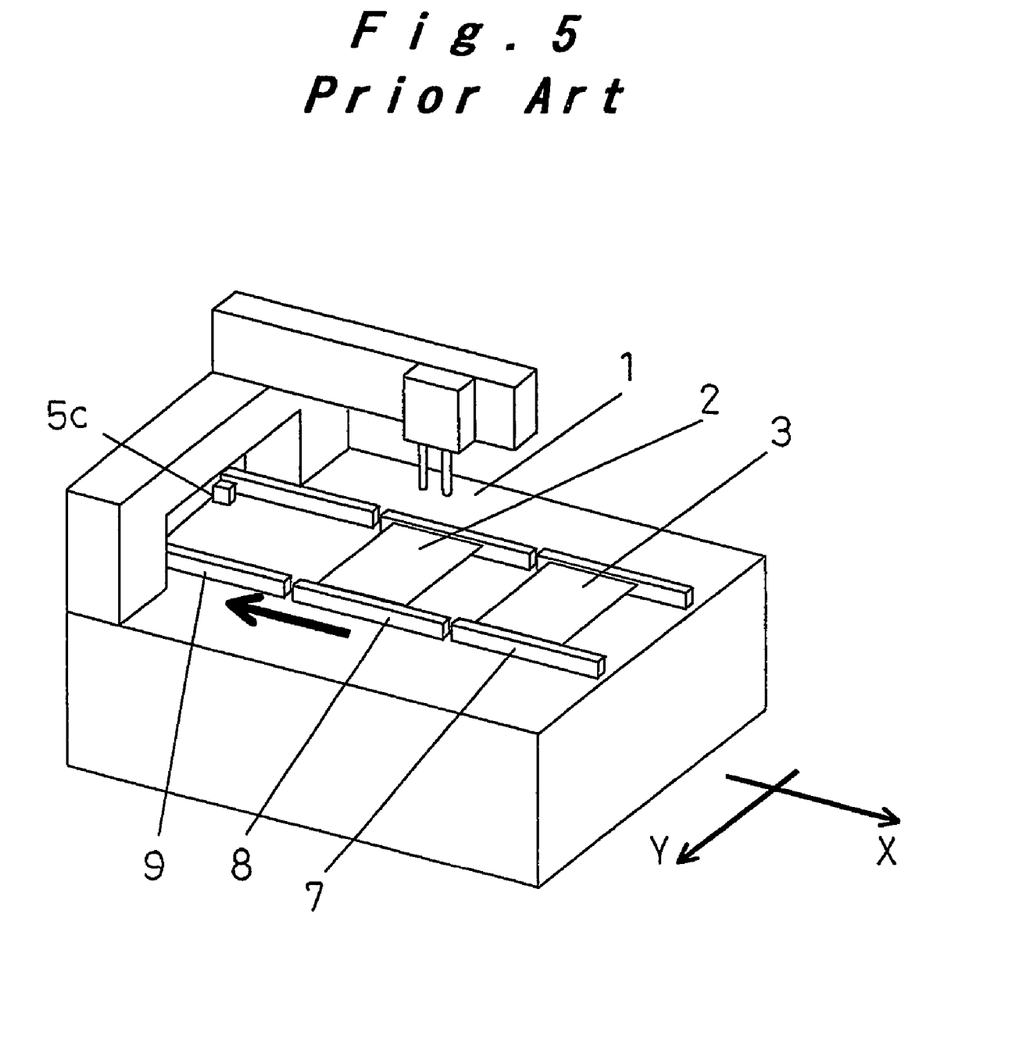
FIG. 5 is a perspective view of an electronic component mounting machine including a conventional substrate transfer apparatus.
Figures 6A, 6B:
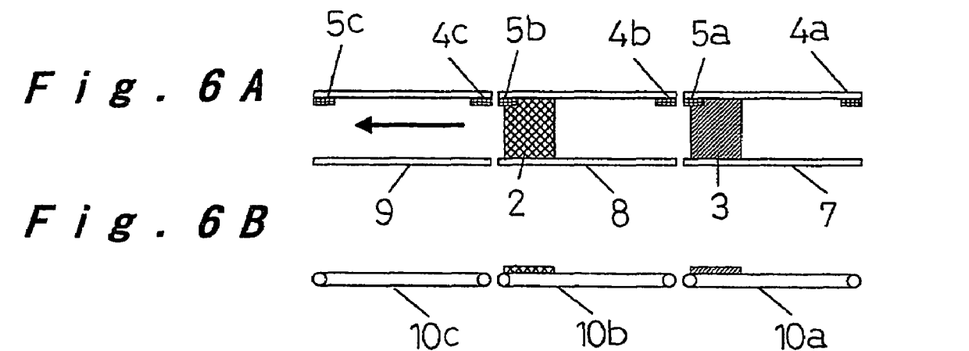
FIGS. 6A-6D are sequential diagrams showing a substrate transfer process in the conventional substrate transfer apparatus.
Figure 6C:
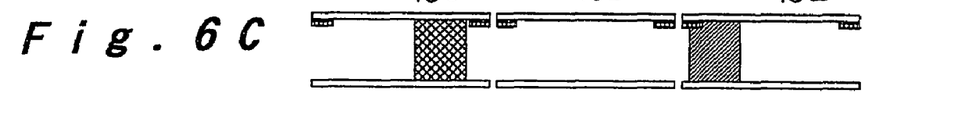
Figure 6D:
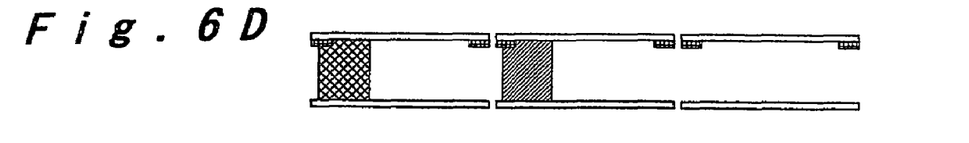
Figure 7A:
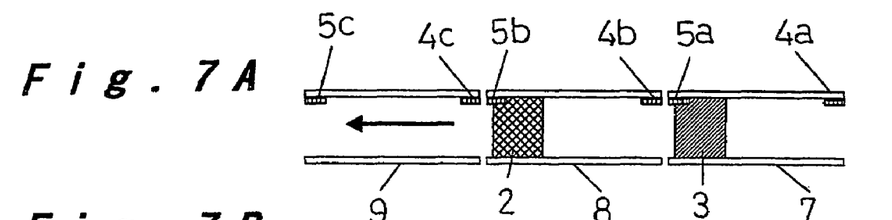
FIGS. 7A-7D are sequential diagrams showing a simultaneous substrate transfer process in the conventional substrate transfer apparatus.
Figure 7B:
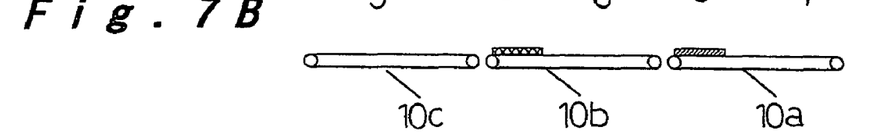

As the above-mentioned type apparatus, a substrate transfer apparatus for an electronic component mounting machine shown in FIG. 5, for example, has been conventionally provided. FIG. 5 is a perspective view of an electronic component mounting machine 1 including a conventional substrate transfer apparatus; FIGS. 6A-6D are sequential views showing a substrate transfer process in the conventional substrate transfer apparatus; and FIGS. 7A-7D are sequential views showing a process of simultaneous transfer of substrates in the conventional substrate transfer apparatus. Among the above-listed figures, FIGS. 6A, 6C, 6D, 7A, 7C, and 7D are views of the substrate transfer apparatus seen from above the apparatus, while FIGS. 6B and 7B are views of the substrate transfer apparatus shown in FIGS. 6A and 7A, respectively, seen from the side of the apparatus.

In FIGS. 5, 6A-6D and 7A-7D, the reference numeral 2 denotes a mounted substrate; 3 an unmounted substrate; 4a, 4b and 4c entrance substrate detecting sensors; 5a, 5b and 5c substrate-arrival detecting sensors; and 10a, 10b and 10c transfer belts. This substrate transfer apparatus has a mounting-waiting process 7, a mounting process 8 and a substrate discharge-waiting process 9. Arrows in FIGS. 5-7D represent a substrate transfer direction. According to such a conventional substrate transfer apparatus, by rotating the transfer belts 10a, 10b, and 10c shown in FIG. 6B, the unmounted substrate 3 can be transferred from the mounting-waiting process 7 to the mounting process 8, and the mounted substrate 2 can be transferred from the mounting process 8 to the substrate discharge-waiting process 9 sequentially.

The above transfer process is described more specifically. In the processes shown in FIGS. 6A and 6B, the transfer belt 10b is first rotated. After the entrance substrate detecting sensor 4c detected the mounted substrate 2, the transfer belt 10c is rotated to transfer the mounted substrate 2 into the substrate discharge-waiting process 9. The fact that the mounted substrate 2 has completely entered the substrate discharge-waiting process 9 can be determined by detecting that the entrance substrate detecting sensor 4c of the substrate discharge-waiting process 9 was placed on a substrate-detected state after the rotation of the transfer belt and thereafter the state of the sensor 4c turned into an undetected state.

By keeping the transfer belts 10b and 10c rotating and further rotating the transfer belt 10a, the unmounted substrate 3 is transferred from the mounting-waiting process 7 to the mounting process 8. FIG. 6C shows a state immediately after the rotation of the transfer belt 10a started.

After the state shown in FIG. 6C, upon detection of the mounted substrate 2 by the substrate-arrival detecting sensor 5c of the substrate discharge-waiting process 9, the rotation of the transfer belt 10c is stopped, thereby finishing the transfer of the mounted substrate 2 from the mounting process 8 to the substrate discharge-waiting process 9. Moreover, when the substrate-arrival detecting sensor 5b of the mounting process 8 detected the unmounted substrate 3, the rotation of the transfer belt 10b is stopped, thereby finishing the transfer of the unmounted substrate 3 from the mounting-waiting process 7 to the mounting process 8. FIG. 6D shows this state.

However, in the above-described transfer process, waiting time is generated from determination that the mounted substrate 2 has completely entered the substrate discharge-waiting process 9 to the start of the transfer of the unmounted substrate 3. In order to reduce the time required for the transfer operation, there is a method in which that waiting time is eliminated and the transfer of the mounted substrate 2 and that of the unmounted substrate 3 simultaneously start. For example, a method for simultaneously transferring a plurality of substrates is effective.

Figure 7C:
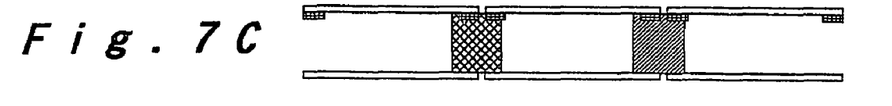
Figure 7D:
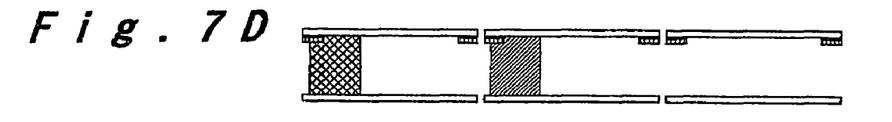

The aforementioned simultaneous transfer method is described more specifically, referring to a substrate transfer apparatus for transferring two substrates simultaneously as an example. In the process shown in FIGS. 7A and 7B, the transfer belts 10a, 10b, and 10c are activated to rotate simultaneously. Thus, it is possible to simultaneously start the transfer of the mounted substrate 2 and the transfer of the unmounted substrate 3. FIG. 7C shows a state immediately after the transfer start of the mounted substrate 2 and unmounted substrate 3. Then, when the substrate-arrival detecting sensor 5c in the substrate discharge-waiting process 9 has detected the mounted substrate 2, the rotation of the transfer belt 10c is stopped. Moreover, when the substrate-arrival detecting sensor 5b in the mounting process 8 has detected the unmounted substrate 3, the rotation of the transfer belts 10a and 10b is halted. As a result, the transfer of the mounted substrate 2 and unmounted substrate 3 is finished. This state is shown in FIG. 7D.

However, when the simultaneous transfer method is performed by using the conventional substrate transfer apparatus described above, a trouble may occur during the transfer of the preceding substrate, for example, the mounted substrate 2 may be got stuck during the transfer. In this case, there is a problem that the following substrate, such as the unmounted substrate 3, catches up with the preceding substrate having the trouble and, if the following substrate eliminates the trouble of the preceding substrate by the impact when the following substrate catches the preceding substrate, a plurality of substrates are transferred to the downstream process continuously.

FIGS. 8A-8D are diagrams showing a process of occurrence of the problem during the simultaneous transfer of a plurality of substrates in the conventional substrate transfer apparatus. In FIGS. 8A-8D, the reference numeral 2 denotes a mounted substrate; 3 an unmounted substrate; 4a, 4b and 4c entrance substrate detecting sensors; 5a, 5b and 5c substrate-arrival detecting sensors; and 10a, 10b and 10c transfer belts. As is the case with FIGS. 5-7D, the reference numeral 7 denotes the mounting-waiting process; 8 the mounting process; and 9 the substrate discharge-waiting process. The arrow in FIGS. 8A-8D represents the substrate transfer direction.

Figures 8A, 8B:
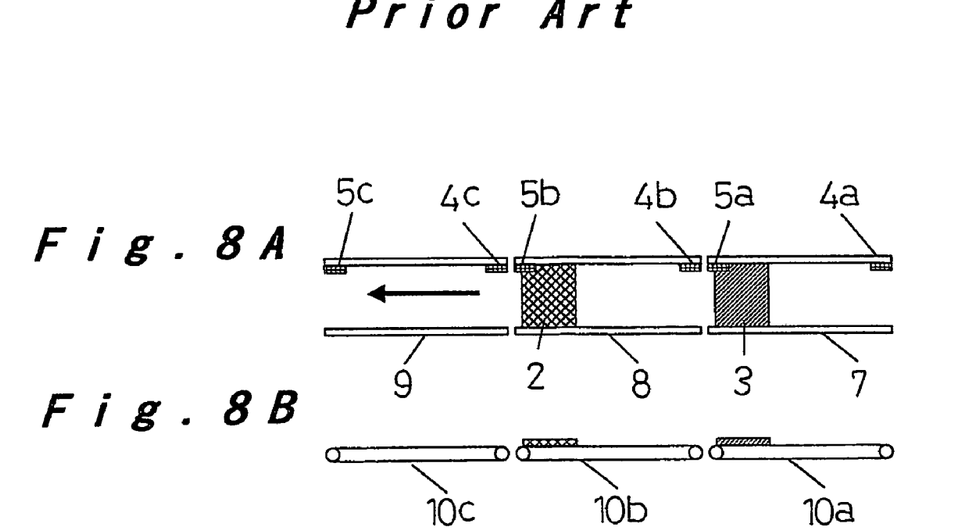
FIGS. 8A-8D are sequential diagrams showing a process in which a trouble occurs when substrates are simultaneously transferred in the conventional substrate transfer apparatus.
Figure 8C:
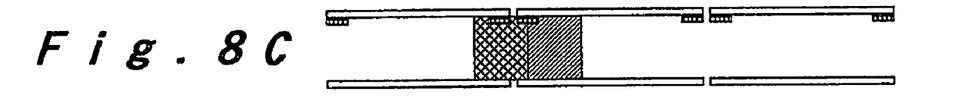
Figure 8D:
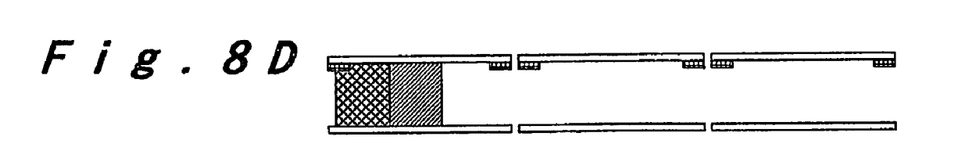

The aforementioned problem is described more specifically, referring to simultaneous transfer of two substrates as an example. In the process shown in FIGS. 8A and 8B, the transfer of the mounted substrate 2 and the transfer of the unmounted substrate 3 are started simultaneously by starting to rotate the transfer belts 10a, 10b, and 10c simultaneously. FIG. 8C shows a state in which the preceding mounted substrate 2 became stuck after the start of the rotation of the transfer belts 10a, 10b, and 10c and the following unmounted substrate 3 caught up with the mounted substrate 2. If the mounted substrate 2 got out of the stuck state by the impact when the unmounted substrate 3 caught up with the mounted substrate 2, for example, the mounted substrate 2 and the unmounted substrate 3 are continuously transferred into the substrate discharge-waiting process 9 although the unmounted substrate 3 is to be stopped at the position of the substrate-arrival detecting sensor 5b in the mounting process 8. This is because the transfer belts 10b and 10c are being rotated. FIG. 8D shows this state.

In a case where the substrate transfer apparatus comes into such a state, when a substrate-request signal was output from equipment connected in the downstream process of the electronic component mounting machine 1 and thus the rotation of the transfer belt 10c was started so as to discharge the mounted substrate 2c, the unmounted substrate 3 was also discharged to the equipment connected in the downstream process. As a result, there is a problem that a defective substrate is generated in which components to be mounted have not been mounted during the process in the electronic component mounting machine 1.

The present invention was made considering the aforementioned two problems. It is an object of the present invention to provide a substrate transfer apparatus for a component mounting machine, that includes detection means for detecting continuous transfer of a plurality of substrates, thereby reducing transfer time, preventing occurrence of a defective substrate in advance, and improving the quality of produced substrates.

DISCLOSURE OF INVENTION

In order to achieve the above object, a first aspect of the present invention is a substrate transfer apparatus for a component mounting machine, for transferring a substrate into a mounting process which mounts components onto the substrate and transferring the substrate from the mounting process. The apparatus of the present invention includes: a mounting-waiting process for making the substrate to be transferred into the mounting process wait before the mounting process; and a substrate discharge-waiting process for making the substrate wait after being transferred from the mounting process wait before a following process, wherein detecting means is provided for detecting, when transfer of an unmounted substrate from the mounting-waiting process to the mounting process and transfer of a mounted substrate for which mounting has been done in the mounting process from the mounting process to the substrate discharge-waiting process are simultaneously performed, that a plurality of substrates have been transferred into the substrate discharge-waiting process continuously. Thus, when a plurality of substrates is simultaneously performed, detecting means determines whether or not a plurality of substrates was continuously carried in from the previous process. Therefore, the first aspect of the present invention has an effect that the transfer of the unmounted substrate to a downstream equipment, that may occur when a plurality of substrates were continuously transferred into the following process, and occurrence of a defective substrate caused by that transfer can be prevented in advance.

A second aspect of the present invention is to form the detecting means by: a substrate-arrival detecting sensor for detecting the mounted substrate transferred into the substrate discharge-waiting process; and a substrate-continuity detecting sensor, provided in the upstream of the substrate-arrival detecting sensor, for detecting the unmounted substrate transferred continuously with the mounted substrate. Thus, the detecting means can be formed by less number of sensors at a lower cost because the substrate-detected state of the substrate-continuity sensor is obtained when the substrate-arrival sensor detected substrate. Therefore, the second aspect of the present invention has an effect that the transfer of the unmounted substrate to the downstream equipment, that may occur when a plurality of substrates were continuously transferred into the following process, and the occurrence of the defective substrate caused by that transfer can be prevented in advance.

A third aspect of the present invention is to arrange the substrate-continuity detecting sensor at a position that satisfies X<XS<2X, where a distance from the substrate-arrival detecting sensor to the substrate-continuity detecting sensor is XS and a substrate dimension in a substrate transfer direction is X. Thus, the detecting means can be formed by less number of sensors without adjustment of sensors for every change of product type because the substrate-detected state of the substrate-continuity detecting sensor is obtained when the substrate-arrival detecting sensor detected substrate. Therefore, the third aspect of the present invention has an effect that the transfer of the unmounted substrate to the downstream equipment, that may occur when a plurality of substrates were continuously transferred into the following process, and the occurrence of the defective substrate caused by that transfer can be prevented in advance.

A fourth aspect of the present invention is to arrange the substrate-continuity detecting sensor to be movable. Thus, the substrate-continuity detecting sensor can be moved by hand and fixed to a given position in accordance with the substrate dimension X in a substrate transfer direction.

A fifth aspect of the present invention is to arrange the substrate-continuity detecting sensor to automatically move to a position that satisfies X<XS<2X in accordance with the substrate dimension X in the substrate transfer direction. Thus, the substrate-continuity sensor can be arranged without adjustment of the sensor for every change of the product type.

Moreover, a sixth aspect of the present invention is to form the detecting means by: the substrate-arrival detecting sensor for detecting the mounted substrate transferred into the substrate discharge-waiting process; and a plurality of substrate-continuity detecting sensors, provided in the upstream of the substrate-arrival detecting sensor at different positions in the substrate transfer direction from each other, for detecting the unmounted substrate that has been transferred continuously with the mounted substrate. Thus, a recovery function can be provided in which only the unmounted substrate is brought back to the mounting process by transferring the unmounted substrate in the reverse direction and thereafter the mounted substrate is transferred to the position of the substrate-arrival detecting sensor in the substrate discharge-waiting process by the transfer in the normal direction.

In addition, a seventh aspect of the present invention is to arrange the substrate-continuity detecting sensors to detect the unmounted substrate by a substrate-detection state of one of the plurality of substrate-continuity detecting sensors that is located at the position satisfying X<XS<2X, where a distance from the substrate-arrival detecting sensor to the one substrate-continuity detecting sensor is XS and a substrate dimension in the substrate transfer direction is X. Therefore, the seventh aspect of the present invention has an effect that the transfer of the unmounted substrate to the downstream equipment, that may occur when a plurality of substrates were continuously transferred into the following process, and the occurrence of the defective substrate caused by that transfer can be prevented in advance by obtaining the substrate-detected state of one of the plurality of substrate-continuity detecting sensors which has such a distance XS from the substrate-arrival detecting sensor that X<XS<2X is satisfied.

Furthermore, as in an eighth aspect of the present invention, the substrate transfer apparatus is formed by the minimum required number of the substrate-continuity detecting sensors by arranging N sensors that satisfy $2^N \times P\_min > P\_max$ at positions determined by $2^n \times P\_min$ $2(n=1, 2, \ldots, N)$ from the minimum substrate size (P_min) and the maximum substrate sizes (P_max) in the substrate transfer direction, respectively, for which the electronic component mounting machine is intended. In this case, the substrate dimension from the minimum substrate size to the maximum substrate size can be obtained in an appropriate manner.

BEST MODE FOR CARRYING OUT THE INVENTION

Embodiment 1

Hereinafter, first to fifth aspects of the present invention are described with reference to a first embodiment.

Figure 1:
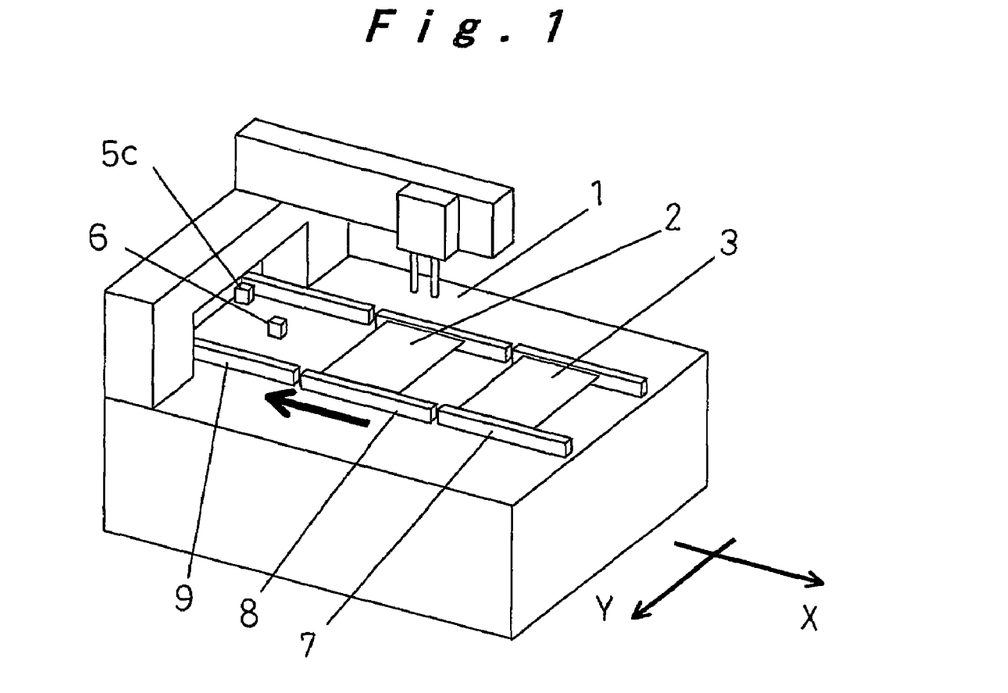
FIG. 1 is a perspective view of an electronic component mounting machine including a substrate transfer apparatus that has a substrate-continuity detecting sensor, according to one example of an embodiment of the present invention.
Figure 2:
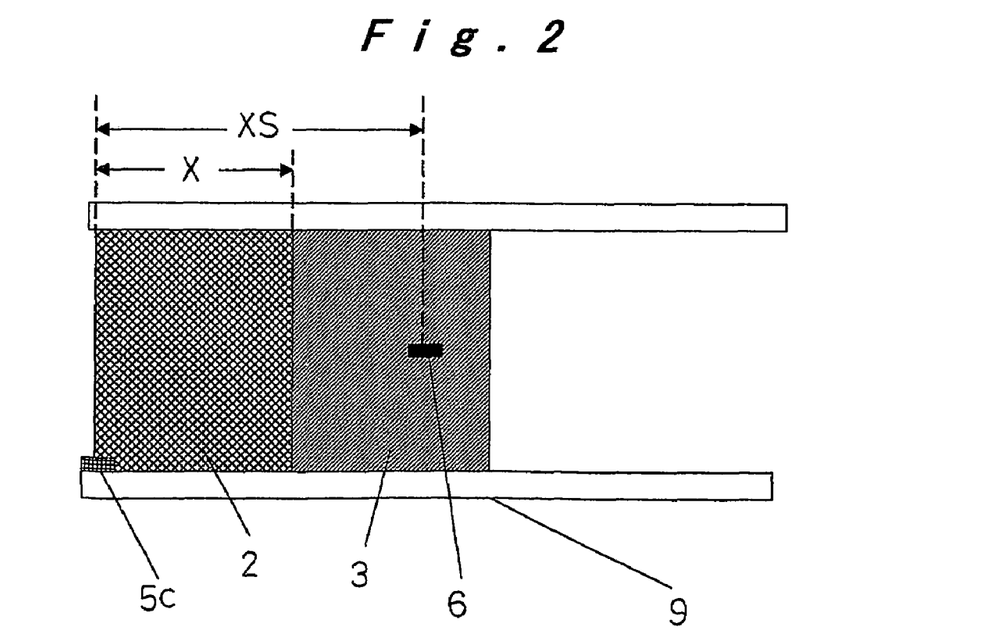
FIG. 2 is a view of a substrate discharge-waiting process in a first embodiment of the present invention, seen from above the substrate discharge-waiting process.

FIG. 1 is a perspective view of an electronic component mounting machine for mounting electronic components, as an exemplary component mounting machine according to an embodiment, and FIG. 2 is a view of a substrate discharge-waiting process 9 in the first embodiment, seen from above the substrate discharge-waiting process 9.

In FIG. 1, the reference numeral 1 denotes an electronic component mounting machine. In this electronic component mounting machine 1, a mounting-waiting process 7, a mounting process 8, and a substrate discharge-waiting process 9 are provided. The reference numeral 2 denotes a mounted substrate while 3 denotes an unmounted substrate. In the substrate discharge-waiting process 9, a substrate-arrival detecting sensor 5c and a substrate-continuity detecting sensor 6 are arranged.

The unmounted substrate 3 that has been carried in the substrate discharge-waiting process 9, shown in FIG. 2, is a substrate which is to be stopped in the mounting process 8, that is the previous process, normally but has been carried into the substrate discharge-waiting process 9 continuously with the mounted substrate 2. In FIG. 2, the substrate dimension (X) in a substrate transfer direction is obtained from a substrate program in which dimension data of substrates has been set. The substrate-continuity detecting sensor 6 is movable by hand to any given position along the substrate transfer direction indicated by the arrow in FIG. 1, so as to be fixed at the given position along the substrate transfer direction. The substrate dimension (X) in the substrate transfer direction has been obtained during production, and, of course, the dimensions (X) of the mounted substrate 2 and unmounted substrate 3 in the substrate transfer direction are equal to each other. XS represents the distance from the detector portion of the substrate-arrival detecting sensor 5c to the detector portion of the substrate-continuity detecting sensor 6. In a case where the substrate-continuity detecting sensor 6 is fixed at the position that satisfies X<XS<2X, when the substrate-continuity detecting sensor 6 is in a substrate-detected state after the substrate-arrival detecting sensor 5c detected a substrate and caused the transfer belt to stop, transferring of a plurality of substrates into the substrate discharge-waiting process 9 is determined. By dealing with the errors after that determination, it is possible to prevent the unmounted substrate 3 from being discharged to the following process, i.e., another equipment connected to the downstream, in advance.

Although the value of the substrate dimension (X) in the substrate transfer direction is obtained from the substrate program in the first embodiment, this value is obtained by measurement using a substrate-passing detection timer, a device for detecting the rotation rate of transfer belt and a timer for measuring a substrate-passing time in an alternative embodiment.

Moreover, the substrate-continuity detecting sensor 6 is movable by hand in the first embodiment. However, it is possible to achieve the same effect in a case where the substrate-continuity detecting sensor 6 is arranged to be automatically movable to an adequate position in accordance with the substrate dimension (X) in the substrate transfer direction.

In addition, the substrate-continuity detecting sensor 6 is provided in the substrate discharge-waiting process 9 that is the final process of the substrate transfer process in the first embodiment. However, it is possible to obtain the same effect even in a case where the substrate-continuity detecting sensor 6 is provided in any of other processes if as long as the substrate transfer apparatus is arranged in such a manner that a plurality of substrates waits before a certain process and there is a possibility that a plurality of substrates are transferred into the certain process.

Furthermore, in the first embodiment, the errors are dealt after the substrate-continuity detecting sensor 6 detected that a plurality of substrates were transferred to the following process. However, it is possible to provide additional substrate-continuity detecting sensor 6 in the process before the process in which the substrate-arrival detecting sensor 5c is provided, i.e., the mounting process 8 in the first embodiment. Referring to FIG. 6 showing the conventional example, it is also possible to provide a recovery function in which only the unmounted substrate 3 is brought back to the mounting process 8 by rotating the transfer belts 10b and 10c in the reverse direction and the mounted substrate 2 is transferred to the position of the substrate-arrival detecting sensor 5c in the discharge-waiting process 9 by rotating the transfer belt 10c in the discharge-waiting process 9 only in the normal direction.

Embodiment 2

Figure 3:
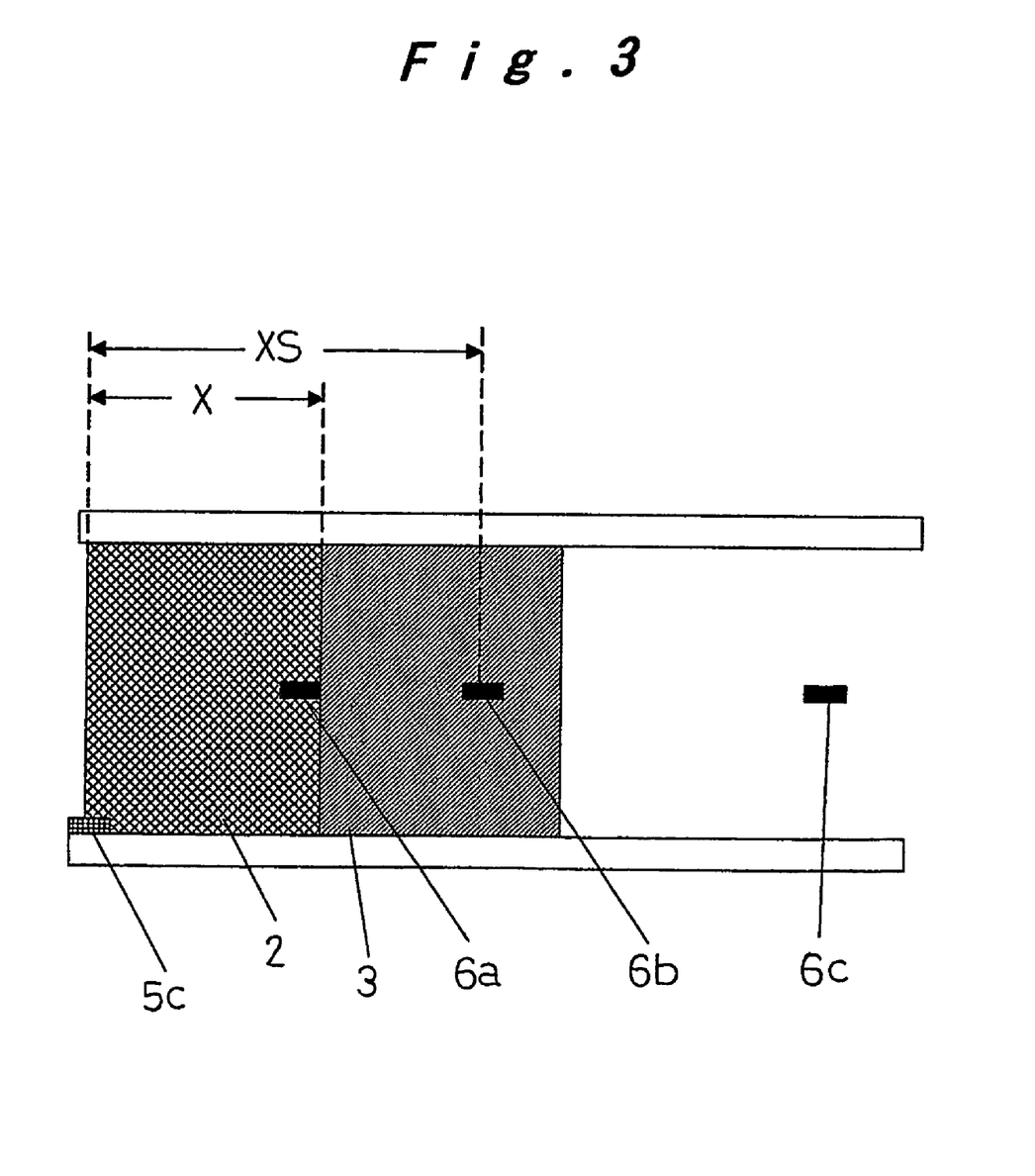
FIG. 3 is a view of the substrate discharge-waiting process in a second embodiment of the present invention, seen from above the substrate discharge-waiting process.
Figure 4A:
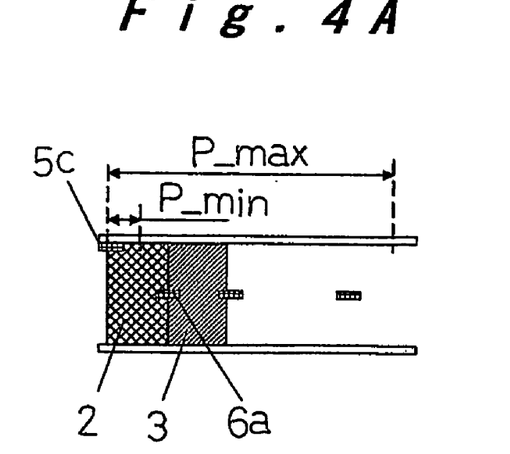
FIGS. 4A-4C are views showing the arrangement of the substrate-continuity detecting sensors in the substrate discharge-waiting process in the second embodiment of the present invention, seen from above the substrate discharge-waiting process.
Figure 4B:
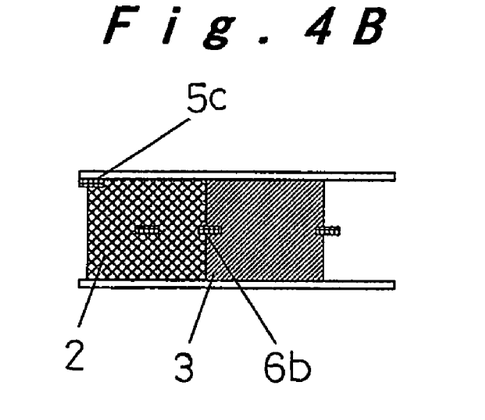
Figure 4C:
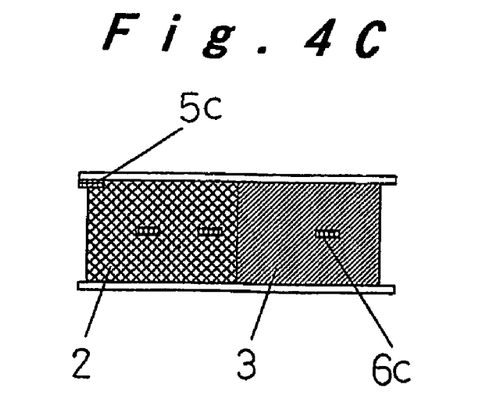

Sixth to eighth aspects of the present invention are described with reference to a second embodiment. FIG. 3 is a view of the substrate discharge-waiting process 9 in the second embodiment, seen from above the process 9. FIGS. 4A-4C are views of the substrate discharge-waiting process 9 in the second embodiment, seen from above the process 9, showing the arrangement of substrate-continuity detecting sensors 6a, 6b, and 6c in the second embodiment.

In FIG. 3, the difference from the first embodiment is that a plurality of substrate-continuity detecting sensors are provided and the substrate-detected state of the substrate-continuity detecting sensor, which is located at the position allowing detection of the continuity of the substrates, is referred to in accordance with the substrate dimension (X) in the substrate transfer direction.

In FIG. 3, in the substrate discharge-waiting process 9, a substrate-arrival detecting sensor 5c and three substrate-continuity detecting sensors 6a, 6b, and 6c are provided. The sensors are arranged at positions determined by $2^n \times P\_min$ (n=1, 2, . . . , N) from the minimum substrate size (P_min) and maximum substrate size (P_max) for which this electronic component mounting machine is intended. Moreover, the substrate dimension (X) in the substrate transfer direction is obtained from the substrate program in which the dimension data of substrate has been set. This value X was obtained during production, and the substrate dimensions (X) in the substrate transfer direction of the mounted substrate 2 and the unmounted substrate 3 are equal to each other. XS is a distance from the detector portion of the substrate-arrival detecting sensor 5c to the detector portion of one of the substrate-continuity detecting sensors 6a-6c that is used for detection in accordance with the substrate dimension (X) in the substrate transfer direction.

When the substrate-arrival detecting sensor 5c detected the mounted substrate 2 and caused the transfer belt 10c (see FIG. 6B) to be halted and thereafter one of the substrate-continuity detecting sensors 6a-6c, which is located at the position satisfying X<XS<2X, is in the substrate-detected state, it is possible to determine a plurality of substrates being carried into the substrate discharge-waiting process 9. By dealing with the errors thereafter, it is possible to prevent the unmounted substrate 3 from being discharged to another equipment connected to the downstream of the process 9.

FIGS. 4A-4C show details of the arrangement of the substrate-continuity detecting sensors 6a-6c in the second embodiment. FIG. 4A shows that the substrate-continuity detecting sensor 6a is capable of detecting the continuity of substrates each having the dimension (X) in the substrate transfer direction in a range from the minimum substrate size (P_min) to ($2 \times P\_min$). FIG. 4B shows that the substrate-continuity detecting sensor 6b is capable of detecting the continuity of substrates each having the dimension (X) in the substrate transfer direction in a range from ($2 \times P\_min$) to ($4 \times P\_min$). FIG. 4C shows that the substrate-continuity detecting sensor 6c is capable of detecting the continuity of substrates each having the dimension (X) in the substrate transfer direction in a range from ($4 \times P\_min$) to (P_max). By arranging the substrate-continuity sensors in the above-mentioned manner, the substrate dimension from the minimum substrate size to the maximum substrate size for which the electronic component mounting machine 1 is intended, is covered by N sensors, N being the minimum required number obtained from $2^N \times P\_min > P\_max$.

It is assumed that the minimum and maximum substrate dimensions in the substrate transfer direction for which the electronic component mounting machine 1 is intended are 50 mm and 330 mm, respectively. In this case, the necessary number of the substrate-continuity detecting sensors is at least three. By arranging the substrate-continuity detecting sensors at positions separated from the substrate-arrival detecting sensor 5c by 100 mm, 200 mm, and 400 mm, respectively, a detection device formed by these sensors for detecting that a plurality of substrates have been continuously carried in detects the continuity of substrates for all the substrate dimensions for which the electronic component mounting machine 1 is intended.

In the second embodiment, the substrate-continuity detecting sensors 6 are arranged at the positions determined by $2^n \times P\_min$ (n=1, 2, . . . , N). However, in order to more stably detect that a plurality of substrates have been carried in, the arrangement of the sensors may be provided with margin. When this margin is assumed to be (á), it is possible to construct a detecting means with more stability for detecting a plurality of substrates continuously carried in by arranging N sensors at the positions determined by $2^n \times P\_min - á$, N being obtained from $2^N \times P\_min > P\_max - á$.

INDUSTRIAL APPLICABILITY

As described above, according to the present invention, in a case where a plurality of substrates are transferred simultaneously, it can be determined by detecting means whether or not a plurality of substrates have been continuously carried in from the previous process. Thus, the problems caused when a plurality of substrates have been discharged to the following process, that an unmounted substrate may be discharged to another equipment connected to the downstream and therefore a defective substrate is generated, can be prevented in advance. Therefore, the present invention is suitable for improving the quality of manufactured substrates while the substrate transfer time is reduced.

The invention claimed is:

1. A substrate transfer apparatus for a component mounting machine, for transferring a substrate to a mounting station in which components are mounted onto the substrate and transferring the substrate from the mounting station, the apparatus comprising:
   a mounting-waiting station for making the substrate to be transferred to the mounting station wait before the mounting station;
   a substrate discharge-waiting station for making the substrate, after being transferred from the mounting station, wait before a following station;
   wherein transfer of a mount-less substrate from the mounting-waiting station to the mounting station, and transfer of a mounted substrate, for which mounting has been done in the mounting station, from the mounting station to the substrate discharge-waiting station are performed simultaneously; and
   wherein a detector is provided at the substrate discharge-waiting station to detect when a plurality of substrates have been transferred into the substrate discharge-waiting station as part of the same transfer, the detector including a substrate-arrival detecting sensor configured to detect the transfer of the mounted substrate to the discharge-waiting station and a substrate-continuity detecting sensor provided upstream of the substrate-arrival detecting sensor, the substrate-continuity detecting sensor being located at a position so as to detect when a following substrate, which immediately follows the transferred mounted substrate, has been transferred simultaneously with the transferred mounted substrate, to the discharge-waiting station.

2. A method of using the substrate transfer apparatus according to claim 1, the method comprising positioning the substrate-continuity detecting sensor at a position that satisfies X<XS<2X, where XS is a distance from the substrate-arrival detecting sensor to the substrate-continuity detecting sensor and X is a substrate dimension in the substrate transfer direction.

3. The method of using the substrate transfer apparatus according to claim 2, the method comprising configuring the substrate-continuity detecting sensor to be movable to the position that satisfies X<XS<2X.

4. The method of using the substrate transfer apparatus according to claim 2, the method comprising automatically moving the substrate-continuity detecting sensor to the position that satisfies X<XS<2X, in accordance with the substrate dimension X in the substrate transfer direction.

5. The substrate transfer apparatus for a component mounting machine according to claim 1, wherein the substrate-continuity detecting sensor comprises a plurality of substrate-continuity detecting sensors, provided upstream of the substrate-arrival detecting sensor at different positions and spaced from one another in a substrate transfer direction.

6. A method of using the substrate transfer apparatus according to claim 5, the method comprising configuring the substrate-continuity detecting sensors to detect the following substrate based upon a substrate-detection state of one of the plurality of substrate-continuity detecting sensors that is located at a position satisfying X<XS<2X, where XS is a distance from the substrate-arrival detecting sensor to the one substrate-continuity detecting sensor and X is a substrate dimension in the substrate transfer direction.

7. A method of using the substrate transfer apparatus according to claim 5, the method comprising providing the substrate transfer apparatus with a minimum required number of the substrate-continuity detecting sensors by arranging N sensors that satisfy $2^N \times P\_min < P\_max$ at positions determined by $2^n \times P\_min\ 2\ (n=1, 2, \ldots, N)$ from a minimum substrate size (P_min) to a maximum substrate size (P_max) in the substrate transfer direction, respectively, with which the electronic component mounting machine is usable.

8. The method of using the substrate transfer apparatus according to claim 6, the method comprising providing the substrate transfer apparatus with a minimum required number of the substrate-continuity detecting sensors by arranging N sensors that satisfy $2^N \times P\_min < P\_max$ at positions determined by $2^n \times P\_min\ 2\ (n=1, 2, \ldots, N)$ from a minimum substrate size (P_min) to a maximum substrate size (P_max) in the substrate transfer direction, respectively, with which the electronic component mounting machine is usable.

9. A method for transferring a substrate to a mounting station at which components are mounted onto the substrate and transferring the component mounted substrate from the mounting station, the method comprising:

providing a mount-waiting station at which the substrate can wait prior to being transferred to the mounting station;

providing a substrate discharge-waiting station at which the component mounted substrate can wait prior to being transferred to a following station;

transferring a mount-less substrate from the mount-waiting station to the mounting station and simultaneously transferring a component mounted substrate, which has been received by the mounting station, from the mounting station to the substrate discharge-waiting station;

providing a detector at the substrate discharge-waiting station to detect when a plurality of substrates have been transferred into the substrate discharge-waiting station as part of the same transfer, the detector including a substrate-arrival detecting sensor configured to detect the transfer of the component mounted substrate to the discharge-waiting station and a substrate-continuity detecting sensor provided upstream of the substrate-arrival detecting sensor, the substrate-continuity detecting sensor being provided at a position so as to detect when a following substrate, which immediately follows the transferred component mounted substrate, has been transferred simultaneously with the transferred component mounted substrate to the discharge-waiting station; and arranging the substrate-continuity detecting sensor at a position that satisfies X<XS<2X, where XS is a distance from the substrate-arrival detecting sensor to the substrate-continuity detecting sensor and X is a substrate dimension in the substrate transfer direction.

* * * * *